United States Patent
Shibata et al.

(10) Patent No.: US 6,193,132 B1
(45) Date of Patent: Feb. 27, 2001

(54) METHOD FOR BONDING SEMICONDUCTOR CHIP AND DEVICE THEREFOR

(75) Inventors: Motojiro Shibata; Yukihiro Ikeya; Tetsuya Kubo, all of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/197,704

(22) Filed: Nov. 23, 1998

(30) Foreign Application Priority Data

Nov. 27, 1997 (JP) .................................... 9-325940

(51) Int. Cl.[7] .......................... B23Q 16/00; B23K 31/00; B23K 37/04
(52) U.S. Cl. ............................. 228/103; 228/9; 228/44.7; 228/104; 228/105
(58) Field of Search ..................... 228/102, 103, 228/105, 8, 9, 10, 12, 44.7, 49.1, 49.5, 104

(56) References Cited

U.S. PATENT DOCUMENTS

| | | | |
|---|---|---|---|
| 3,838,274 | * 9/1974 | Doubek, Jr. et al. | 250/201 |
| 3,946,931 | * 3/1976 | Bahnck et al. | 228/102 |
| 4,054,386 | * 10/1977 | Suzuki | 356/153 |
| 4,347,964 | * 9/1982 | Takasugi et al. | 228/4.5 |
| 4,671,446 | * 6/1987 | Sherman | 228/4.5 |
| 4,899,921 | * 2/1990 | Bendat et al. | 228/105 |
| 5,042,709 | * 8/1991 | Cina et al. | 228/105 |
| 5,092,033 | * 3/1992 | Nishiguchi et al. | 29/840 |
| 5,113,565 | * 5/1992 | Cipolla et al. | 29/25.01 |
| 5,212,880 | * 5/1993 | Nishiguchi et al. | 29/739 |
| 5,302,854 | * 4/1994 | Nishiguchi et al. | 257/737 |
| 5,342,460 | * 8/1994 | Hidese | 156/64 |
| 5,529,236 | * 6/1996 | Kobayashi | 228/102 |
| 5,590,456 | * 1/1997 | Armington et al. | 29/721 |
| 5,628,660 | * 5/1997 | Onitsuka | 445/24 |
| 5,680,698 | * 10/1997 | Armington et al. | 29/833 |
| 5,829,125 | * 11/1998 | Fujimoto et al. | 29/840 |
| 5,928,399 | * 7/1999 | Yakou et al. | 65/152 |

FOREIGN PATENT DOCUMENTS

| | | |
|---|---|---|
| 362131528 | * 6/1987 | (JP) . |
| 362131529 | * 6/1987 | (JP) . |
| 405152794 | * 6/1993 | (JP) . |
| 5-251535 | 9/1993 | (JP) . |
| 406244245 | * 9/1994 | (JP) . |
| 6-268050 | * 9/1994 | (JP) . |
| 6-310569 | * 11/1994 | (JP) . |
| 7-142545 | 6/1995 | (JP) . |
| 8-078479 | * 3/1996 | (JP) . |
| 408330393 | * 12/1996 | (JP) . |
| 8-335603 | * 12/1996 | (JP) . |
| 9-064085 | * 3/1997 | (JP) . |

* cited by examiner

*Primary Examiner*—Patrick Ryan
*Assistant Examiner*—Kiley Stoner
(74) *Attorney, Agent, or Firm*—Oblon, Spivak, McClelland, Maier & Neustadt, P.C.

(57) ABSTRACT

A method of bonding a semiconductor chip, including step of photographing a surface of a semiconductor chip, on which an electrode is formed, and detecting a relative position of the electrode with respect to the semiconductor chip, a bonding step of making the electrode of the semiconductor chip to face a circuit pattern provided on a substrate, and bonding the electrode to the circuit pattern, a step of photographing the substrate on which the semiconductor chip is formed, and detecting a relative position of the semiconductor chip with respect to the substrate. Also included is a step of evaluating a bonding accuracy by calculating a relative position of the electrode with respect to the substrate from the relative position of the semiconductor chip with respect to the substrate and the relative position of the electrode with respect to the semiconductor chip.

19 Claims, 4 Drawing Sheets

METHOD FOR BONDING SEMICONDUCTOR CHIP AND DEVICE THEREFOR

BACKGROUND OF THE INVENTION

The present invention relates to a semiconductor bonding method for bonding a semiconductor chip such as an IC to a substrate, in a face-down manner, and more specifically to a bonding method capable of detecting an error in terms of position, between an electrode of a semiconductor chip and a wiring line provided on a substrate, after a face-down bonding, by inspecting it from outside, and a device therefor.

As one of the methods for directly mounting and bonding a semiconductor chip such as an IC to a mount substrate such as a print wiring substrate, there is a method in which a surface in which the electrode (bump electrode) of a semiconductor chip is formed is made to face a substrate, and the electrode is directly bonded to the wiring pattern of the substrate. This method is generally called "face-down bonding" since the bonding operation is carried out while holding the surface of the semiconductor chip on which the electrode is formed facing downwards.

In the face-down bonding as above, the joint portion between the electrode and the circuit pattern is covered by the semiconductor chip, and therefore it is difficult to confirm if the bonding has been accurately carried out.

In order to detect whether or not bonding has been accurately carried out, that is, to inspect the accuracy of bonding, the method in which the status of the joint portion between the electrode and circuit pattern is physically observed so as to judge if the bonding is good or no good, is generally employed.

More specifically, there is a method in which a semiconductor device which has been subjected to the face-down bonding is sampled at a certain period, and the semiconductor chip is stripped off or cut from the substrate so as to inspect the joint portion of the electrode, and a method in which the joint portion between the electrode and the circuit pattern is examined from a rear side of the substrate transparently.

The method which involves stripping or cutting the semiconductor chip requires the transfer of a sampled semiconductor chip to a separate device, where the stripping and cutting is carried out, the entire system thereby becoming large in size. Further, the inspection cannot be conducted at real time during the bonding operation.

Further, with the transparent inspection method, it is not possible to obtain a clear image of the joint portion, and therefore an accurate inspection cannot be conducted. More specifically, for example, a ceramic substrate or glass substrate is used as the substrate, and particularly, in the case of the ceramic substrate, the amount of light transmission is very small. As a result, it is very difficult to confirm even the outline of a semiconductor chip, not to mention the joint portion between the electrode and circuit pattern.

Further, in the case where a semiconductor chip is face-down bonded to a glass substrate, it is difficult to obtain a clear image of the joint portion between the electrode and circuit pattern due to the state of the refraction of the glass substrate or the presence of the circuit pattern, although the outline of the semiconductor chip can be traced.

BRIEF SUMMARY OF THE INVENTION

Under these circumstances, the main object of the present invention is to provide a method of manufacturing a semiconductor device, which is capable of easily and accurately inspecting the bonding accuracy after a semiconductor chip is face-down bonded to a substrate.

Another object of the present invention is to provide a method of manufacturing a semiconductor device, capable of inspecting the alignment accuracy between a bump and a substrate by observation from outside without performing stripping or cutting of the device, after the face-down bonding.

In order to achieve the above-described objects, there is provided, according to the present invention, a method of bonding a semiconductor chip, comprising:

the step of photographing a surface of a semiconductor chip, on which an electrode is formed, and detecting a relative position of the electrode with respect to the semiconductor chip;

the bonding step of making the electrode of the semiconductor chip to face a circuit pattern provided on a substrate, and bonding the electrode to the circuit pattern;

the step of photographing the substrate on which the semiconductor chip is formed, and detecting a relative position of the semiconductor chip with respect to the substrate; and the step of evaluating a bonding accuracy by calculating a relative position of the electrode with respect to the substrate from the relative position of the semiconductor chip with respect to the substrate and the relative position of the electrode with respect to the semiconductor chip.

In connection with the above method, it is preferable that the step of detecting the relative position of the electrode with respect to the semiconductor chip, should include photographing of the semiconductor chip from a surface side on which the electrode is formed, and detecting a position of the electrode with reference to a predetermined location of the semiconductor chip; and the step of detecting the relative position of the semiconductor chip with respect to the substrate, should include photographing of the semiconductor chip mounted on the substrate, from a surface side on which the electrode is not formed, and detecting the relative position of the predetermined location of the semiconductor chip, with reference to an alignment mark formed on the substrate as a reference.

With the above-described structure, the position of the electrode is detected with reference to a predetermined location of the semiconductor chip in advance to the bonding, and the relative position of the predetermined location of the semiconductor chip, with respect to the substrate is detected after the bonding. In this manner, the position of the electrode with respect to the substrate can be obtained by calculation. Therefore, it becomes possible to inspect the bonding accuracy without stripping the semiconductor chip from the substrate or cutting it.

Further, it is preferable that the predetermined location should be an edge of the semiconductor chip, especially a corner edge thereof. With this structure, it becomes unnecessary to provide a mark on the semiconductor chip.

It should be noted that the evaluation of the bonding accuracy should be carried out by comparing the relative position of the electrode with respect to the substrate with a predetermined reference value, and the reference value should be set by performing the teaching operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to accompanying drawings.

Figure 1:
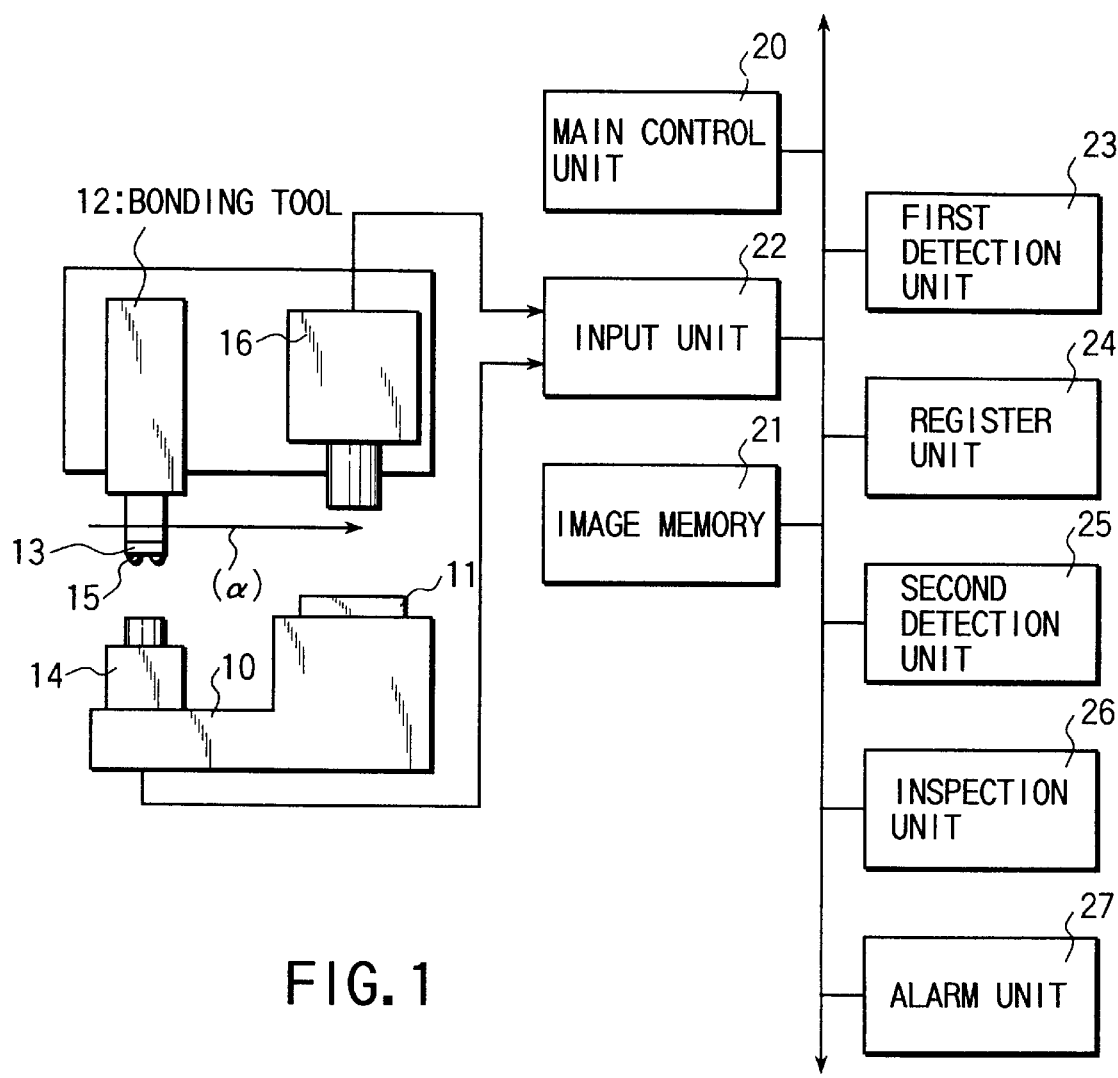
FIG. 1 is a diagram showing an embodiment of the apparatus for manufacturing a semiconductor device, according to the present invention.

FIG. 1 is a diagram showing the entire structure of an apparatus for manufacturing a semiconductor device.

Figure 10:
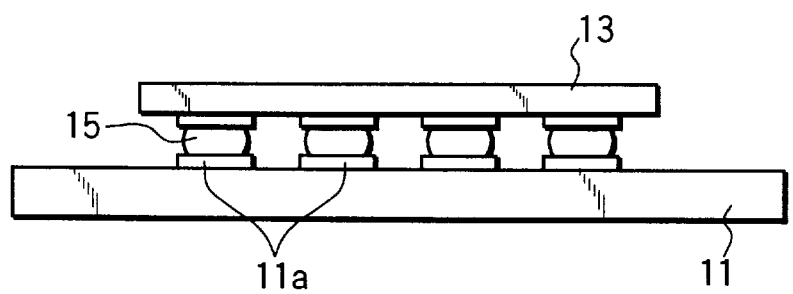
FIG. 10 is a diagram showing a semiconductor device in which a semiconductor chip is face-down bonded.

In this apparatus, as shown in FIG. 10, a semiconductor chip 13 such as IC, in which a bump electrode 15 is formed on its surface, is mounted on a substrate 11 on which a wiring pattern 11a is formed, in a face-down manner, and the bump electrode 15 is bonded to the wring pattern 11a (the face-down bonding).

As shown in FIG. 1, the apparatus includes a bonding tool 12 for adsorbing and holding a semiconductor chip 13 in a face-down state, that is, the bump electrode 15 is facing downwards, and a bonding stage 10 for holding a substrate 11 on which the semiconductor chip 13 is bonded. The bonding tool 12 moves in the direction indicated by the arrow (a) in the figure while adsorbing and holding the semiconductor chip 13, so as to make the semiconductor chip 13 face the substrate 11.

Further, on the downstream side of the passage (a) of the bonding tool 12, a first recognition camera 14 for recognizing and picking up an image of the semiconductor chip 13 held by the bonding tool 12 is provided. The first recognition camera 14 has the function of picking up the image of the lower surface of the semiconductor chip 13 before bonding, that is, the bump electrode 15 of the semiconductor chip 13, and outputting an image signal thereof.

On the lateral surface of the bonding tool 12, a second recognition camera 16 which moves together with the bonding tool 12 as an integral body, is provided. The second recognition camera 16 has the function of picking up a reference pattern (denoted by reference numeral 28 in FIGS. 3A and 3B) formed on the substrate 11 before and after the semiconductor chip 13 is bonded onto the substrate 11, and outputting an image signal thereof.

Meanwhile, FIG. 1 shows a main control unit 20 for controlling the entire manufacture apparatus. To a bus to which the main control unit 20 is connected, an input unit 22 for receiving image signals from the first and second recognition cameras 14 and 16, an image memory 21 for storing image data input to the input unit 22, a first detection unit 23 for generating alignment data used for the bonding operation, a second detection unit 25 for generating data used for inspecting the bonding accuracy, a register unit 24 in which a reference value set for inspecting the bonding accuracy is registered, an inspection unit 26 for inspecting the bonding accuracy, and an alarm unit 27 for generating a necessary alarm on the basis of the detection result obtained by the inspection unit 26, are connected.

Of these members, the first detection unit 23 calculates alignment data necessary for carrying out the face-down bonding. More specifically, from the image memory 21, the image of the semiconductor chip 13 (bump electrode 15) before bonding, which is picked up by the first recognition camera 13, and the image of the reference pattern 28 before bonding, which is picked up by the second recognition camera 16, are accessed. Then, the correction angle for the inclination of the semiconductor chip 13, and the drive amount for the bonding tool 12, which are necessary for aligning the semiconductor chip 13 with respect to the substrate 11, are determined.

In the meantime, the second detection unit 25 outputs a signal indicating the relative position of the bump electrode 15 after executing the bonding, with respect to the reference pattern 28, in order to evaluate the bonding accuracy. More specifically, from the image memory 21, the image of the semiconductor chip 13 (bump electrode 15) before bonding, which is picked up by the first recognition camera 13, and the images of the semiconductor chip 13 after the bonding and the reference pattern 28, which are picked up by the second recognition camera 16, are accessed. Then, the relative position of the bump electrode 15 with respect to the reference pattern 28 after bonding is detected.

The detection made by the second detection unit 25 will now be described in detail.

Figure 2A:
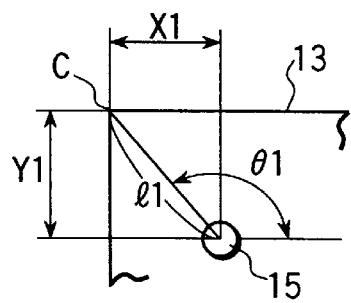
FIGS. 2A and 2B are schematic diagrams illustrating the operation of detecting a lateral surface of a semiconductor chip using the above apparatus.
Figure 2B:
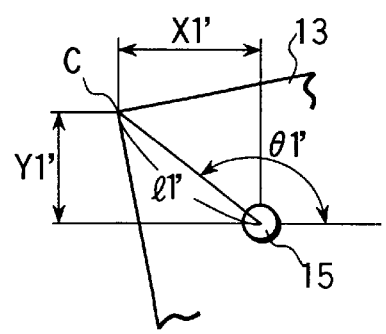

First, the second detection unit 25 detects the relative position of the bump electrode 15 with respect to the outline of the semiconductor chip 13. FIGS. 2A and 2B are conceptual diagrams illustrating the detection method used here. FIG. 2A shows an image of the semiconductor chip 13, which is held in an ideal state, whereas FIG. 2B shows an image of the semiconductor chip 13 which is displaced (inclined and offset).

As shown in FIG. 2A, the relative position of the bump electrode 15 is obtained in the form of coordinates (X1, Y1) with reference to the corner edge c of the semiconductor chip 13. The coordinates (X1, Y1) indicate a distance $1_1$ from the corner edge c of the semiconductor chip 13 and the inclination $\theta_1$ of the semiconductor chip 13.

By contrast, in actual measurements, the relative position of the bump electrode 15 with respect to the semiconductor chip 13 is displaced, for example, as shown in FIG. 2B. In such a case, the relative position of the bump electrode 15 is obtained in the form of coordinates (X1', Y1') taken with reference to the corner edge C of the semiconductor chip 13. The coordinates (X1', Y1') indicate a distance $1_{1'}$ from the corner edge c of the semiconductor chip 13 and the inclination $\theta_{1'}$ of the semiconductor chip 13. The difference between $\theta_1$ and $\theta_{1'}$ is an angle error which remains after the correction of the inclination of the semiconductor chip 13, carried out on the basis of the detection result made by the first detection unit 23, and the angle error is usually within ±2°

Figure 3A:
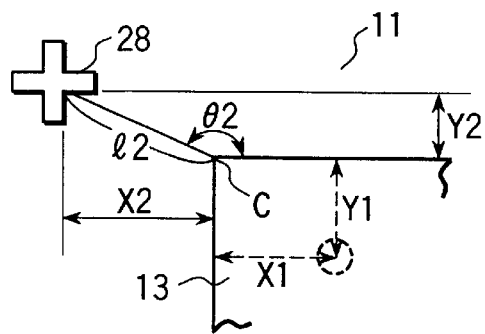
FIGS. 3A and 3B are schematic diagrams illustrating the operation of detecting a gap between the lateral surface of a semiconductor chip and a reference mark, using the above apparatus.

Next, the second detection unit 25 detects the relationship between the semiconductor chip 13 and the substrate 11 in terms of position, after the bonding. FIG. 3A shows an image of the semiconductor chip 13 and substrate 11 (reference pattern 28), when they are face-down bonded in an ideal state, whereas FIG. 3B shows an image of the semiconductor chip 13 and substrate 11 (reference pattern 28) after an actual bonding operation.

Figure 3B:
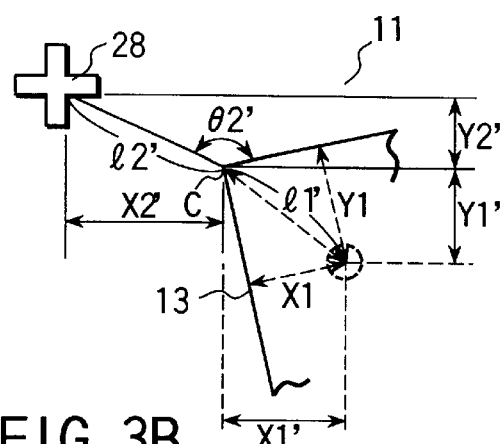

As shown in FIGS. 3A and 3B, the relationship between the semiconductor chip 13 and the substrate 11 in terms of position can be detected by obtaining the coordinates (X2, Y2) or (X2', Y2') of the corner edge c of the semiconductor chip 13 with regard to the reference pattern 28 on the substrate 11 taken as the origin. The coordinates (X2, Y2) and (X2', Y2') indicate, respectively, distances 12 and 12' from the corner edge c to the reference pattern 28, and inclinations $\theta_2$ and $\theta_{2'}$. The difference between $\theta_1$ and $\theta_{1'}$, results due to the inclination error of the semiconductor chip 13 and the alignment error of the substrate 11, caused by the bonding stage 10, after bonding.

From the detection results illustrated in FIGS. 2A and 3A, the relative position (Xs, Ys) of the bump electrode 15 with respect to the reference pattern 28 in the case where an ideal face-down bonding is carried out, can be obtained as follows.

Xs=X1+X2

Ys=Y1+Y2

These values Xs and Ys are registered as reference values S in the register unit 24 shown in FIG. 1.

Further, from the detection results illustrated in FIGS. 2B and 3B, the relative position (Xs', Ys') of the bump electrode 15 with respect to the reference pattern 28 after an actual face-down bonding, can be obtained as follows (the relative position (Xs', Ys') will be called detection values hereinafter).

Xs'=X1'+X2'

Ys'=Y1'+Y2'

The inspection unit 26 shown in FIG. 1 has the function of comparing the difference between the reference values Xs and Ys and the detection values Xs' and Xs', with a predetermined threshold value H, and judging the case where the difference falls out of the threshold value H to be no good. The alarm unit 27 has the function of alarming the operator of the apparatus, as it operates when a case is judged by the inspection unit 26 to be no good.

Figure 4:
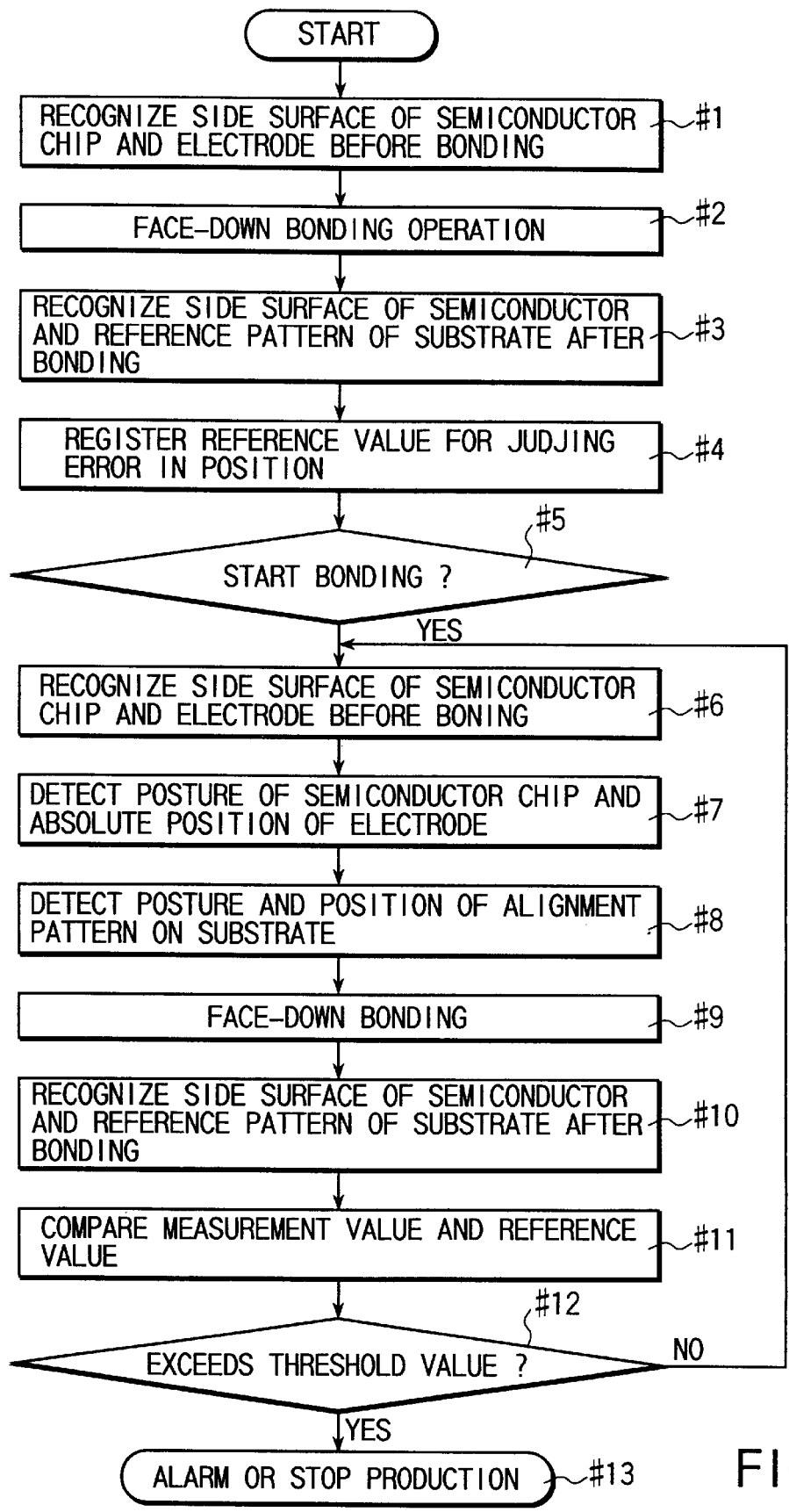
FIG. 4 is a flowchart of a detection carried out by the apparatus.

Next, the operation of the face-down bonding apparatus will now be described with reference to the flowchart shown in FIG. 4.

First, in order to register the reference values Xs and Ys for the judgment of an alignment error, an ideal face-down bonding operation is played back in Steps #1 to #4, thus carrying out a teaching operation.

That is, a substrate 11 is placed on a bonding stage 10 at high accuracy. In the substrate 11, the reference pattern 28, and a circuit pattern 11a for bonding bump electrodes 15 are arranged in an ideal manner (FIG. 10). Further, on the distal end of the bonding tool 12, the semiconductor chip 13 on which the bump electrodes 15 are arranged at ideal positions is held by adsorption in a face-down manner (FIG. 5).

Figure 5:
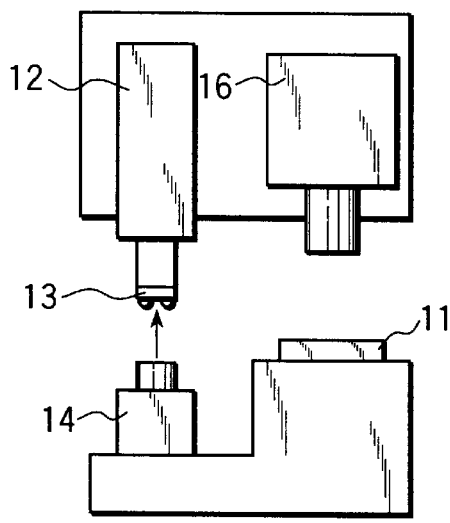
FIG. 5 is a diagram illustrating the operation of detecting a lateral surface of a semiconductor chip.
Figure 6:
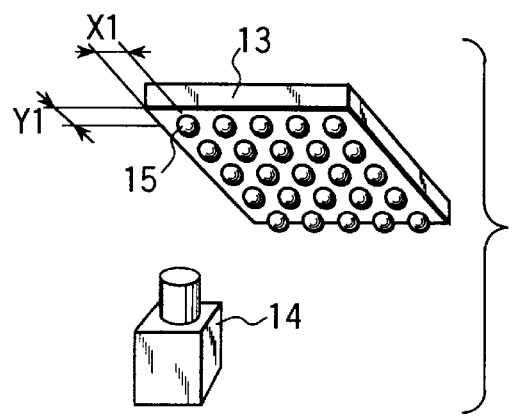
FIG. 6 is a diagram showing how to pick up an image of a lateral surface of a semiconductor chip.

First, in Step #1, the semiconductor chip 13 adsorbed by the bonding tool 12 is placed in the view field of the first recognition camera 14, as shown in FIG. 5. Then, the image of the lower surface of the semiconductor chip 13 is picked up from the below side of the semiconductor chip 13 as shown in FIG. 6, and thus it is possible to output an image signal shown in FIG. 2A. The image data is stored in the image memory 21 via the input unit 22.

Subsequently, the second detection unit 25 reads out the image data stored in the image memory 21, and detects the coordinates (X1, Y1) of the relative position of the bump electrode, from the image data as shown in FIG. 2A. In this case, of electrodes (bump) 15, the one which is located closest to the corner of the semiconductor chip 13 is detected as a representative.

After that, the bonding tool 12 is moved in the x-axial direction and the bonding stage 10 is moved in the y-axial direction, such as to make the semiconductor chip 13 face the upper surface of the substrate 11. In this manner, the face-down bonding operation for the semiconductor chip 13 is carried out in an ideal alignment state (Step #2).

Figure 7:
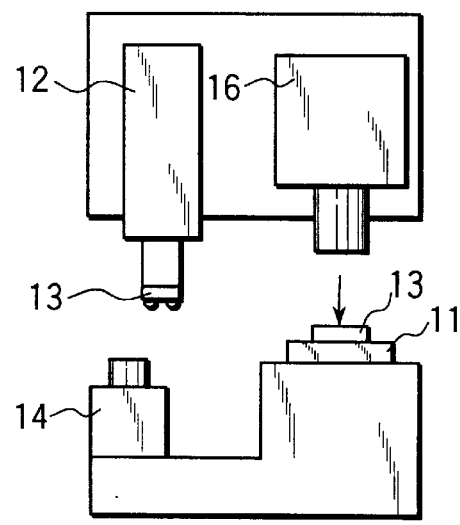
FIG. 7 is a diagram showing how to pick up an image of a reference pattern on a substrate.
Figure 8:
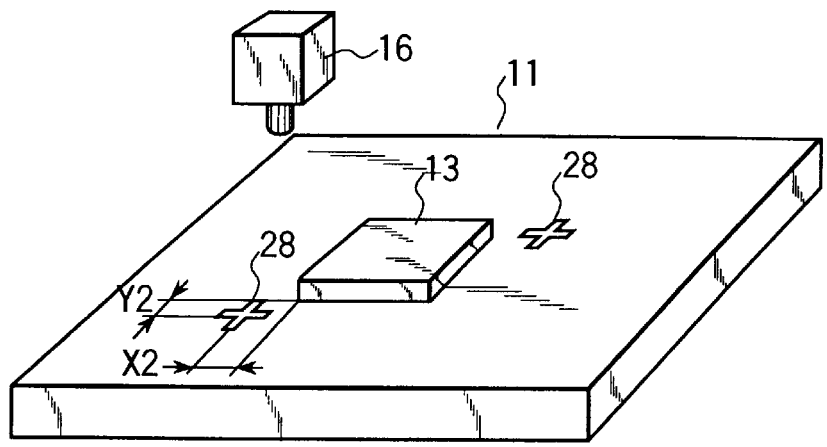
FIG. 8 is a schematic diagram showing how to pick up an image of a reference pattern on a substrate.

After the bonding operation, the second recognition camera 16 is moved to a section above the substrate 11 on which the semiconductor chip 13 is mounted as shown in FIG. 7. Then, the outline of the corner portion of the semiconductor chip 13 which has been bonded in Step #2, and the reference pattern 28 formed on the substrate 11 are photographed by the second recognition camera 16 as shown in FIG. 8. The image data is stored in the image memory 21 via the input unit 22.

Then, the second detection unit 25 reads out the image data stored in the image memory 21. From this image data, the relationship between the semiconductor chip 13 ideally bonded and the reference pattern 28 on the substrate 11 in terms of position, is obtained in the form of coordinate (X2, Y2) shown in FIG. 3A.

Next, in Step #4, the reference value for the judgment of an alignment error is registered in the register unit 24. That is, the second detection unit 25 detects the reference position (Xs, Ys) with respect to the reference pattern 28 of the bump electrode 15, from the relative position (X1, Y1) of the bump electrode 15 with respect to the corner edge c of the semiconductor chip 13 and the relative position (X2, Y2) of the corner edge c of the semiconductor chip 13 with respect to the reference pattern 28, on the basis of the equations:

Xs=X1+X2

Ys=Y1+Y2, and thus obtained reference position is registered in the register unit 24.

The above-described teaching operation is carried out for every one lot in the manufacture of products.

After the above operation, the actual bonding is started as illustrated by Steps #5 to #12.

First, when the instruction of the start of the bonding is received in Step #5, an operation similar to that of Step #1 is executed in Step #6. More specifically, the relative coordinates (X1', Y1') of the bump electrode 15 with respect to the corner edge c of the semiconductor chip 13 is obtained by the second detection unit 25 as can be seen in FIG. 2B.

Subsequently, in Step #7, the first detection unit 23 reads out, from the memory 21, the image picked up by the first recognition camera 14, and the posture of the semiconductor chip 13 and the absolute coordinates thereof are thus detected.

In Step #8, the second recognition camera 16 is set to face the reference pattern 28 on the substrate 11 so as to pick up an image of the reference pattern 28, and the image thus picked up is stored in the image memory 21. The first detection unit 23 reads out the image thus picked up, and detects the posture of the reference pattern 28 and the absolute coordinates thereof.

Further, the main control unit 20 drives the bonding tool 12 on the basis of the results of the detection of the positions of the bump electrode 15 and the reference pattern 28 (Steps #7 and #8), so as to make the semiconductor chip 13 to face and be aligned with the substrate 11. Then, the bonding tool 12 moves the semiconductor chip 13 down, and bond the chip onto the substrate 11 in a face-down manner (Step #9).

After the chip is face-down-bonded, an operation similar to that of Step #3 is carried out in Step #10. More specifically, the relative coordinates (X2', Y2') of the corner edge c of the semiconductor chip 13, with respect to the reference pattern 28 are obtained by the second detection unit 25 as can be seen in FIG. 3B.

Next, in Step #11, the reference values Xs and Ys, and the detection values Xs' and Ys' (Xs'=X1'+X2', Ys'=Y1'+Y2') are compared with each other by the inspection unit, so as to judge if the difference between these values exceeds the threshold value H, and then the operation moves on to Step #12.

In the case where the difference does not exceed the threshold value H, the face-down bonding of a next semiconductor chip 13 is executed continuously (Steps #6 to #11), whereas in the case where the difference exceeds the threshold value H, an alarm is generated from the alarm unit 27 in Step #13.

It should be noted that it is not necessary to perform the inspection (Steps #6, 10, 11 and 12) for each and every bonding operation, but it suffices if it is carried out once in several times at random.

With the structure described above, the relative position of the bump electrode 15 and the relative position of the reference pattern 28 are obtained by taking the corner edge c of the semiconductor chip 13 as a reference. Therefore, it is possible to obtain the relative positions of the reference pattern 28 and the bump electrode 15 after the bonding. Thus, even after the bonding, the bonding accuracy can be evaluated without removing or cutting the semiconductor chip 13 from the substrate 11.

In particular, since the corner edge c, which is located at the same position if viewed from above and below, is employed as the reference position used for obtaining the relative position, the reliability of the alignment is high. Alternatively, it is possible to use a mark provided at the same position if viewed from above and below. Further, even with marks which are located at different positions between the upper and lower surfaces, they can be used as the reference positions as long as the relationship between the relative positions of the upper and lower surfaces is maintained at high accuracy.

Lastly, the present invention is not limited to the above-described embodiment, but can be remodeled into a version which will be described.

Figure 9:
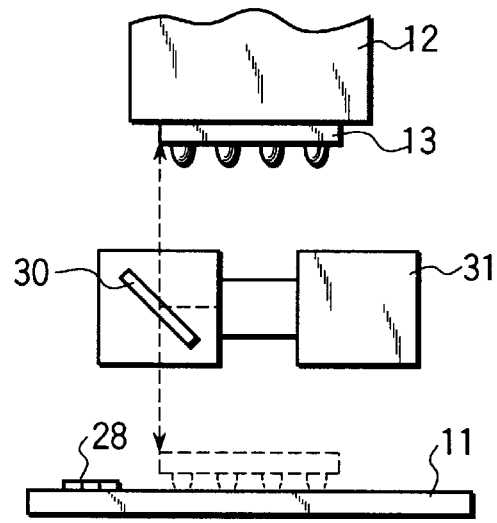
FIG. 9 is a diagram showing the structure of an alternative version of the device of the present invention.

For example, as shown in FIG. 9, it is possible that a beam splitter 30 is provided between the substrate 11 and the semiconductor chip 13, and a recognition camera 31 is provided in its branching-off direction, so as to pick up the image of the semiconductor chip 13 by one camera, which is the recognition camera 31.

Further, reference patterns 28 on the substrate 11 may be formed at positions symmetrical with respect to the semiconductor chip 13, for example, as shown in FIG. 8, and it is possible to use one or both reference patterns 28 for carrying out the inspection.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor chip bonding method comprising:
   a step of photographing a surface of a semiconductor chip, on which an electrode is formed, and detecting a relative position of the electrode with respect to a semiconductor chip;
   a bonding step of making the electrode of the semiconductor chip to face a circuit provided on a substrate, and bonding the electrode to the circuit;
   a step of photographing the substrate on which the semiconductor chip is formed, and detecting a relative position of the semiconductor chip with respect to the substrate; and
   the step of evaluating a bonding accuracy by calculating a relative position of the electrode with respect to the substrate from the relative position of the semiconductor chip with respect to the substrate and the relative position of the electrode with respect to the semiconductor chip.

2. A bonding method according to claim 1, wherein the detection of the relative position of the electrode with respect to the semiconductor chip is performed with reference to an edge of the semiconductor chip.

3. A bonding method according to claim 1, wherein the detection of the relative position of the electrode with respect to the semiconductor chip is performed by detecting a position of an edge of the semiconductor ship and a position of the electrode adjacent to the edge.

4. A bonding method according to claim 1, wherein the detection of the relative position of the semiconductor chip with respect to the substrate is performed by detecting a position of a mark provided on the substrate and a position of an edge of the semiconductor chip.

5. A bonding method according to claim 1, wherein the circuit provided on the substrate is an electrode and/or a circuit pattern.

6. A bonding method according to claim 1, wherein the evaluation of the bonding accuracy is carried out by comparing the relative position of the electrode of the semiconductor chip with respect to the substrate, with a predetermined reference value.

7. A bonding method according to claim 6, further comprising a step for calculating the reference value.

8. A bonding method according to claim 7, wherein the step for calculating the reference value is performed by obtaining the relative position of the electrode with respect to the substrate in a case where the electrode of the semiconductor chip and the circuit on the substrate are aligned with each other.

9. A bonding method according to claim 6, further comprising an alarm step for generating an alarm when the relative position of the electrode of the semiconductor chip, with respect to the substrate, differs from the reference value by a predetermined degree.

10. A bonding method according to claim 1, wherein the step of detecting the relative position of the electrode with respect to the semiconductor chip, includes photographing of the semiconductor chip from a surface side on which the electrode is formed, and detecting a position of the electrode with reference to a predetermined location of the semiconductor chip; and the step of detecting the relative position of the semiconductor chip with respect to the substrate, includes photographing of the semiconductor chip mounted on the substrate, from a surface side on which the electrode is not formed, and detecting the relative position of the predetermined location of the semiconductor chip, with reference to an alignment mark formed on the substrate as a reference.

11. A bonding method according to claim 10, wherein the predetermined location is an edge of the semiconductor chip.

12. A bonding apparatus for mounting a semiconductor chip on a substrate, comprising:

a first image pick up member configured to photograph a surface of the semiconductor chip on which an electrode is formed;

a second image pick up member configured to photograph a surface of the substrate on which a semiconductor is mounted;

a bonding mechanism configured to mount the semiconductor chip on the substrate by making the electrode of the semiconductor chip to face a circuit provided on the substrate, and bonding the electrode to the circuit pattern;

an electrode position detection unit configured to calculate a relative position of the electrode of the semiconductor chip with respect to the substrate, from a relative position of the electrode with respect to the semiconductor chip, which was detected by the first image pick up member before the bonding and a relative position of the semiconductor chip with respect to the substrate, which was detected by the second image pick up member after the bonding; and an evaluation unit configured to evaluate a bonding accuracy on the basis of the relative position of the electrode with respect to the substrate, which is calculated by the electrode position detection unit.

13. A bonding apparatus according to claim 12, wherein the electrode position detection unit detects the relative position of the electrode with respect to the semiconductor chip, with reference to an edge of the semiconductor chip.

14. A bonding apparatus according to claim 13, wherein the electrode position detection unit detects the relative position of the electrode with respect to the semiconductor chip, by detecting a position of an edge of the semiconductor chip and a position of the electrode adjacent to the edge.

15. A bonding apparatus according to claim 12, wherein the electrode position detection unit detects the relative position of the semiconductor chip with respect to the substrate, by detecting a position of a mark provided on the substrate and a position of an edge of the semiconductor chip.

16. A bonding apparatus according to claim 12, wherein the evaluation unit evaluates the bonding accuracy by comparing the relative position of the electrode of the semiconductor chip with respect to the substrate, with a predetermined reference value.

17. A bonding apparatus according to claim 16, further comprising a reference value calculation unit configured to calculate the reference value.

18. A bonding apparatus according to claim 17, wherein the reference value calculation unit calculates the reference value by obtaining the relative position of the electrode with respect to the substrate in a case where the electrode of the semiconductor chip and the circuit on the substrate are aligned with each other.

19. A bonding apparatus according to claim 16, further comprising an alarm unit configured to generate an alarm when the relative position of the electrode of the semiconductor chip, with respect to the substrate, differs from the reference value by a predetermined degree or more.

* * * * *